United States Patent
Mohwinkel

[19]

[11] Patent Number: 6,094,114
[45] Date of Patent: Jul. 25, 2000

[54] SLOTLINE-TO-SLOTLINE MOUNTED FLIP CHIP

[75] Inventor: Clifford A. Mohwinkel, San Jose, Calif.

[73] Assignee: Endgate Corporation, Sunnyvale, Calif.

[21] Appl. No.: 09/136,431

[22] Filed: Aug. 18, 1998

Related U.S. Application Data

[63] Continuation-in-part of application No. 08/725,972, Oct. 4, 1996, Pat. No. 5,983,089, which is a continuation-in-part of application No. 08/400,025, Mar. 6, 1995, Pat. No. 5,698,469, which is a continuation-in-part of application No. 08/313,927, Sep. 26, 1994, abandoned.

[51] Int. Cl.$^7$ ........................................................ H01P 5/02
[52] U.S. Cl. ........................ 333/247; 257/728; 257/778; 257/664
[58] Field of Search .................................. 333/246, 247; 257/728, 778, 664

[56] References Cited

U.S. PATENT DOCUMENTS

| | | |
|---|---|---|
| 3,939,430 | 2/1976 | Dickens et al. . |
| 4,032,849 | 6/1977 | Gysel et al. . |
| 4,097,814 | 6/1978 | Cohn . |
| 4,135,168 | 1/1979 | Wade . |
| 4,193,048 | 3/1980 | Nyhus . |
| 4,249,263 | 2/1981 | Shinkawa et al. . |
| 4,320,536 | 3/1982 | Dietrich . |
| 4,376,287 | 3/1983 | Sechi . |
| 4,377,005 | 3/1983 | Marchand et al. . |
| 4,411,022 | 10/1983 | Clifton et al. . |
| 4,485,488 | 11/1984 | Houdart . |
| 4,523,163 | 6/1985 | Houdart et al. . |
| 4,542,535 | 9/1985 | Bates et al. . |
| 4,553,265 | 11/1985 | Clifton et al. . |
| 4,553,266 | 11/1985 | Bates et al. . |
| 4,603,436 | 7/1986 | Butler . |
| 4,607,394 | 8/1986 | Nightingale . |
| 4,658,440 | 4/1987 | Pavio et al. . |
| 4,739,519 | 4/1988 | Findley . |

(List continued on next page.)

FOREIGN PATENT DOCUMENTS

| | | |
|---|---|---|
| 0 358 497 A2 | 3/1990 | European Pat. Off. . |
| 0 627 765 A1 | 12/1994 | European Pat. Off. . |
| 41 28334 A1 | 3/1993 | Germany . |
| 60-153602 | 8/1985 | Japan . |
| 63-240102 | 10/1988 | Japan . |
| 1-005102 | 1/1989 | Japan . |

OTHER PUBLICATIONS

S. Weiner, D. Neur, S. Spohrer, "2 to 8 GHZ Double Balanaced Mesfet Mixer with +DMB Input $3^{rd}$ Order Intercept:", 1988 IEEE MTT–S Digest, pp. 1097–1100.

Masayoshi Aikawa et al., "MMIC Progress in Japan", IEEE 1989 Microwave and Millimeter–Wave Monolithic Circuits Symposium Digest of Papers, Jun. 12–13, 1989, pp. 1–6, IEEE, U.S.A.

M. Goetz et al., "Measurement of a 24–$GH_z$ Broad–Band Multilayer Ceramic Feedthru for Micro– wave Packaging", *IEEE Microwave and Guided Wave Letters*, May 1992, No. 5, pp. 171–173.

H.B. Sequeira et al., "Monolithic GaAs W–Band Pseudomorphic Modfet Amplifiers", $12^{th}$ Annual GaAs Symposium Technical Digest 1990, Oct. 7–10, 1990, pp. 161–164.

John J. Burke et al., "Surface–to–Surface Transition via Electromagnetic Coupling of Microstrip and Coplanar Waveguide", *IEEE Transactions on Microwave Theory and Techniques*, vol. 37, No. 3, Mar. 1989, pp. 519–525.

*Primary Examiner*—Benny Lee
*Attorney, Agent, or Firm*—Edward B. Anderson

[57] ABSTRACT

A high frequency circuit structure including a base substrate having a planar face, a first base slotline mounted on the base substrate face and consisting of first and second, spaced-apart coplanar base conductors, and a circuit chip flip-mounted on the base substrate. The circuit chip include a chip substrate having a planar face facing the planar face of the base substrate. A slotline resident on the chip is flip mounted onto the base slotline. Input and output connections made according to the invention can be used to provide connections to an intermediate circuit resident on either the chip or the base substrate. A second chip slotline may be electrically in series or parallel with the first chip slotline.

14 Claims, 3 Drawing Sheets

U.S. PATENT DOCUMENTS

| | | |
|---|---|---|
| 4,751,744 | 6/1988 | Pavio, Jr. . |
| 4,816,789 | 3/1989 | Mars ........................................ 333/246 |
| 4,949,398 | 8/1990 | Maas . |
| 4,955,079 | 9/1990 | Connerney et al. . |
| 5,066,926 | 11/1991 | Ramachandran et al. . |
| 5,087,896 | 2/1992 | Wen et al. . |
| 5,115,245 | 5/1992 | Wen et al. . |
| 5,127,102 | 6/1992 | Russell . |
| 5,138,436 | 8/1992 | Koepf . |
| 5,142,239 | 8/1992 | Brayton et al. . |
| 5,149,671 | 9/1992 | Koh et al. . |
| 5,194,833 | 3/1993 | Dougherty et al. . |
| 5,265,266 | 11/1993 | Trinh . |
| 5,266,963 | 11/1993 | Carter . |
| 5,303,419 | 4/1994 | Ittipiboon et al. . |
| 5,345,194 | 9/1994 | Nagasako . |
| 5,355,095 | 10/1994 | Nathanson et al. . |
| 5,528,203 | 6/1996 | Mohwinkel . |
| 5,535,445 | 7/1996 | Gunton . |
| 5,610,563 | 3/1997 | Mohwinkel . | a continuation-in-part of application Ser. No. 08/725,972, filed Oct. 4, 1996, U.S. Pat. No. 5,983,089, which is a continuation-in-part of application Ser. No. 08/400,025, filed on Mar. 6, 1995, U.S. Pat. No. 5,698,469, which is a continuation-in-part of application Ser. No. 08/313,927, filed on Sep. 26, 1994, now abandoned.

BACKGROUND OF THE INVENTION

1. Field of the Invention

This invention relates to high frequency transmission line circuit structures, and in particular to a chip having a resident slotline flip-mounted onto a base slotline.

2. Description of Related Art

Mounting flip-chips on a motherboard has been found to be an effective way to connect radio frequency circuit components together. Conducting columns or bumps connect a chip to a motherboard and can be formed using solder, brazing material, plated metal such as gold, epoxy or other conductive adhesive.

Also, in such high frequency application, the use of coplanar transmission lines is well established. Typical examples include coplanar waveguides (ground-signal-ground lines) and slotlines. Slotlines may be formed by spaced opposite-polarity conductors, balanced ground-signal-signal-ground lines, and parallel-strip balanced lines. These coplanar transmission lines are particularly useful because of the simplified structure provided by having the signal-forming conductors on a single plane.

A slotline typically consists of two conductors mounted on a face of a substrate. The conductors are spaced apart to form a slot. The slot is narrow enough for the conductors to be closely coupled, thereby making the conductor edges extending along the slot function as the primary transmission line. Slotlines are typically used to conduct balanced signals, such as are used in push-pull circuits. These circuits may or may not have a corresponding ground plane on the opposite or back side of the substrate. Slotlines also have the advantages of not needing cross-over conductors and having fewer conductors compared to coplanar waveguides.

Slotline conductors are historically made with a semi-infinite width, with each conductor covering all of the portion of the face of the substrate to the side of the slot. A slotline may also be formed by conductor trips having limited widths. Conventionally, a coplanar waveguide consists of two coupled slotlines having the same signal and opposite polarity.

As used herein, a slotline is distinguished from a coplanar waveguide primarily in that the transmission line formed by a slotline for a given signal consists of only two conductors. This is to say, each conductor is only associated with one other conductor to form the transmission line. On the other hand, a coplanar waveguide has three conductors, an inner signal conductor bounded by spaced outer conductors with the outer conductors having the same polarity and sharing in the conduction of current relative to the middle conductor. In a coplanar waveguide, the center conductor is associated with both outer conductors to form the transmission line.

This definition does not preclude the use of other conductors in association with one or both of two slotline conductors for transmitting other signals or multiples of the same signal, for impedance matching or for other functions, so long as the other conductors have arbitrary signal polarities relative to those of the slotline conductors.

Also as used herein, a chip circuit is one or more electrical components formed in or on a chip substrate. Typically, integrated circuits are formed on a chip substrate to form a chip circuit. Other forms of circuit structure may also be formed on a chip. When the chip is flip-mounted onto a base substrate, the chip, containing the chip circuit is referred to as a flip-chip. A flip-chip may contain one or more circuits, elements or devices, each of which may or may not be interconnected on the chip.

In a common amplifier application, the chip circuit is an integrated circuit containing one or more stages of active devices, such as transistors, and other passive devices, such as resistors, capacitors, transmission lines and inductors. In a power chip having a plurality of transistors, the transistors may be individually or collectively connected to the motherboard. Impedance-matching for the composite power transistor can be accomplished on the motherboard substrate in order to minimize the size of the chip substrate. Impedance matching may also be provided on the chip.

As has been mentioned, chips mounted on a base substrate or motherboard may contain simple or complex circuits. More complex circuits are commonly referred to as monolithic microwave integrated circuits, or MMICs for short. When embodied as a microstrip circuit, the chip has a back side ground plane. It is also known to mount MMICs having resident coplanar waveguides by flip mounting the resident coplanar waveguides onto corresponding coplanar waveguides mounted on a base substrate, as is disclosed by Wen et al. in U.S. Pat. No. 5,115,245. The structure disclosed by Wen et al. does not require a back side ground plane and associated vias for connecting circuit components with ground.

Coplanar waveguides however produce a different set of problems. Coplanar waveguides require two ground conductors on opposite sides of a central signal conductor. The additional conductors take up more area of the chip surface. The embodiments disclosed by Wen et al. have a single input or output coplanar waveguide on each end of the chip.

Gaps between conductors of about one mil are required for 50 ohm lines, such as typical coplanar waveguides. This is a severe manufacturing problem because of the difficulty of producing gaps consistently with such small spacing. This condition is exacerbated by the characteristic of low impedance interconnects to be more sensitive to minute variations in manufacture than high impedance interconnects.

Coplanar waveguides also exhibit several radiation modes that dissipate energy and produce coupling between circuits. Cross coupling can cause oscillation and produce pass band ripples or notches. Coplanar waveguides are also inherently difficult to launch directly to a shielded waveguide.

SUMMARY OF THE INVENTION

The present invention provides a circuit structure that allows for a reduction in the chip area required for input/output and internal circuitry connections, thereby permitting a greater concentration of connections per unit area of chip surface, while reducing manufacturing constraints and improving circuit performance.

This is provided in the present invention by a high frequency circuit structure having an electrically insulating base substrate with a planar face, a base slotline mounted on the base substrate face and consisting of first and second, spaced-apart coplanar base conductors, and a circuit chip flip-mounted on the base substrate. The circuit chip includes an electrically insulating chip substrate having a planar face facing the planar face of the base substrate, and a slotline formed on the chip substrate. A pair of chip terminals couple the chip slotline to the base slotline for conducting a signal relative to the base slotline. Input and output connections made according to the invention are used to provide coupling to an intermediate circuit resident on either the chip or the base substrate.

The slotline flip-chip interface of the invention provides several benefits. Slotlines transmit signals by only the push-pull mode and the microstrip mode. There is no far-field radiation for the push-pull mode. This allows the interconnects to be made more simply, having fewer mode suppression elements and the circuits exhibit greater isolation. Correspondingly, the associated signals are propagated with flatter response curves and lower loss.

The slotline interface, requiring only two conductors, results in less chip area used for the input/output interface. Two conductors take up less physical space than three. Further, there are reduced mode suppression requirements and supporting conductor interconnects, such as cross-over wires or air bridges. Bulky, passive circuit elements may be formed on the base substrate rather than on the chip, and less bulky elements, such as high frequency coupling capacitors can be more compactly formed on the chip. These benefits mean the chip sizes can be reduced and the chips produced at a lower cost.

Slotlines also allow the connection of sources or loads in series. Two lines in series, each having a typical impedance of 50 ohms, for example, have a total impedance of 100 ohms. This higher impedance allows for wider gap spacing between conductors, and interconnects that are less sensitive to variations in manufacture.

The invention thus provides for the advantageous use of flip mounting radio frequency chip slotlines directly onto base slotlines. More compact circuit structures for amplifiers, mixers, oscillators and the like may thereby be realized. These and other features and advantages of the present invention will be apparent from the preferred embodiments described in the following detailed description and illustrated in the accompanying drawings.

DETAILED DESCRIPTION OF THE PREFERRED EMBODIMENTS

Figure 1:
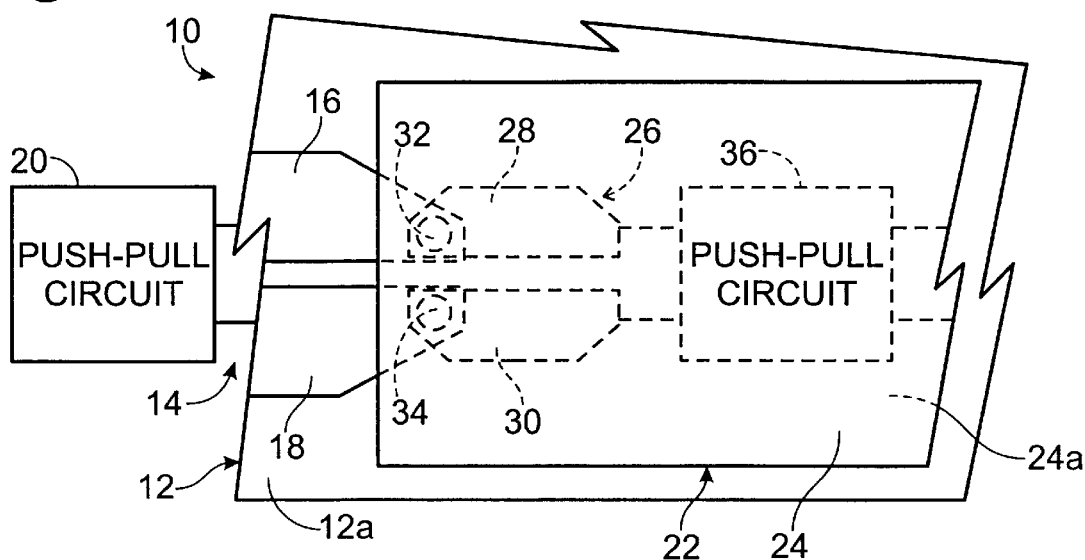
FIG. 1 is a plan view of a first embodiment of the invention in the form of an input interface with a chip-resident slotline.

Referring initially to FIG. 1, an input interface circuit structure made according to the invention is shown generally at 10. Circuit structure 10 includes a base substrate 12 having a planar face 12a on which is mounted a base slotline 14 having opposing conductors 16, 18. Slotline 14 couples to a chip 22 a high frequency signal from an associated push-pull or other appropriate circuit 20, which is typically mounted on the base substrate or on a chip mounted on the base substrate.

Chip 22 includes a chip substrate 24 having a planar face 24a, hidden from view in the figure, which faces base substrate face 12a. A chip slotline 26 has opposing conductors 28, 30. The ends of the chip slotline are flip mounted onto the ends of the base slotline conductors, as represented by connecting bumps 32, 34.

Bumps 32, 34 are preferably gold-to-gold thermocompression bonds. Since gold is a component of MMIC processing, it is readily available. Gold bumps and pads can be made much smaller than solder bumps. For instance, solder pads have a standard width of about five mils. Gold pads can be one mil in width. Further, gold has better electrical and thermal conductivity than solder. These features combine to allow closer placement of gold bumps near a heat source on a chip, and thereby provide more effective heat drain from the chip.

Figure 2:
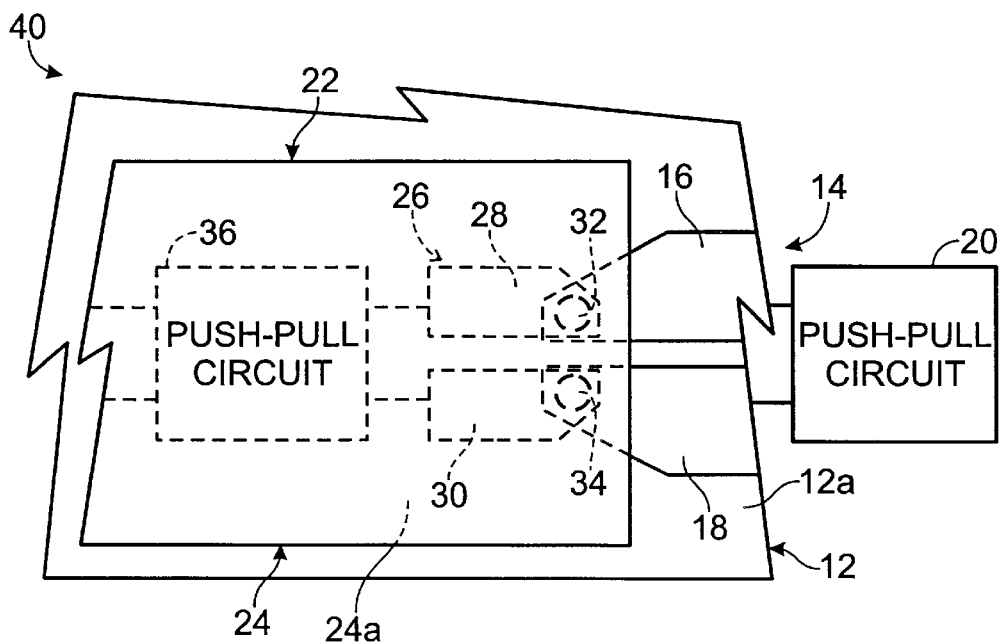
FIG. 2 is a plan view of a second embodiment of the invention in the form of an output interface with a chip-resident slotline.

The other ends of the chip slotline conductors are preferably coupled to a push-pull circuit 36 mounted on the chip. As will be seen with reference to the embodiment of FIGS. 1 and 2, push-pull circuit 36 may be connected to an output interface or to an intermediate circuit on the chip.

As will be apparent to one skilled in the art, interface circuit structure 10 of FIG. 1 may be formed as an input interface or as an output interface. Thus, by simply reversing the illustrated components, assuming signal travel from left to right, an output interface is formed, such as output interface circuit structure 40 shown in FIG. 2. Because of the interchangeable nature of this structure, the components of circuit structure 10 are assigned to circuit structure 40, and are not described in detail for FIG. 2 it being understood that the push-pull circuits will be different, as is illustrated in FIG. 3.

Figure 3:
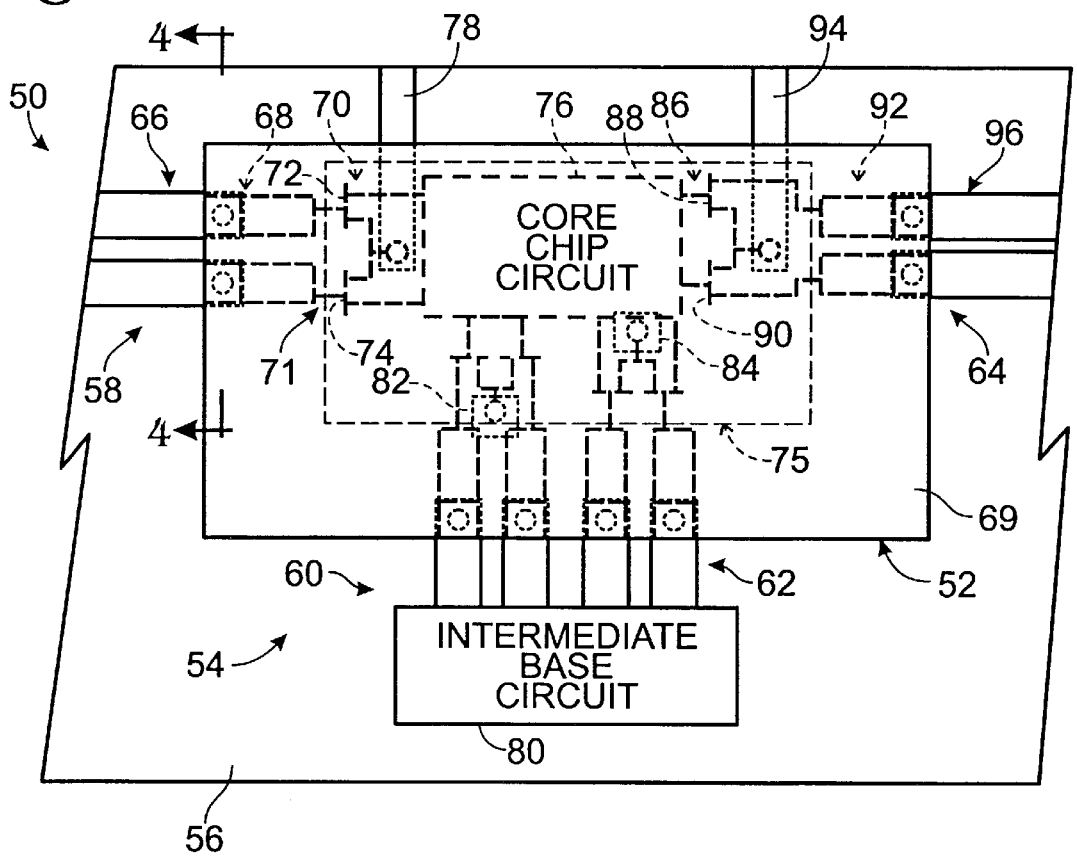
FIG. 3 is a plan view of a third embodiment of the invention having a chip with multiple interfaces according to the embodiments of FIGS. 1 and 2.
Figure 4:
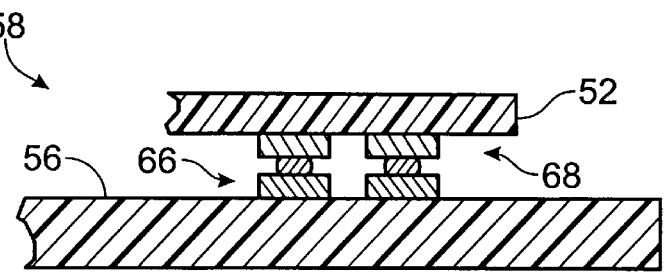
FIG. 4 is a cross section taken along line 4—4 in FIG. 3.

Referring now to FIGS. 3 and 4, an exemplary multiple interface circuit structure 50 (see FIG. 3) made according to the invention is shown. Circuit structure 50 illustrates a few of the ways that a MMIC chip 52 can interface with a base circuit 54 (see FIG. 3) formed on a base substrate 56. Circuit structure 50 further includes a first input interface 58, a first output interface 60, a second input interface 62 and a second output interface 64 as shown in FIG. 3.

Input interface 58 includes an initial input base slotline 66 flip mounted to an initial input chip slotline 68, as has been described relative to FIGS. 3 and 4. Now referring to FIG. 3 in particular, slotline 68, mounted on a chip substrate 69, is coupled to a push-pull circuit 70 having active device means 71 in the form of DC-series connected field-effect transistors 72 and 74. Circuit 70 is part of an intermediate chip circuit 75. In particular the conductors of the slotline are connected to the gates of the transistors. The drains of the transistors are connected to a core chip circuit 76, which could be an amplifier, mixer, oscillator, a combination of these circuits, or other such functional unit. The sources of the FETs are coupled to a base ground conductor 78 for DC bias. The sources may also be connected together on the chip to provide connection to a bias conductor.

Intermediate circuit 75 may be a combination of active and passive elements, such as those used in amplifiers, oscillators and mixers. Some elements, such as a filter, coupler, coil or large capacitor, may be sufficiently large that it is more economical to form them on the case substrate and provide connections to them from the intermediate chip circuit. This would then be the basis for having an intermediate base circuit 80 which is coupled to the intermediate chip circuit via output and input interfaces 60 and 62. Circuit 80 may also include push-pull circuits, as appropriate. As is illustrated the input and output interfaces are preferably similar to input interface 58, taking into account the direction of signal travel with regard to the configuration of the push-pull circuits.

Referring now to FIG. 3 in particular, of note in this case is the use of a ground pad 82 for the output push-pull circuit connections, and a ground pad 84 for the input push-pull circuit connections to the base substrate. These base ground pads may be formed as described previously using gold thermocompression bonding onto a via connected to a base substrate backside ground plane and heat sink. Similar contacts may also be used within the perimeters of intermediate chip circuit 75.

Second output interface 64 accordingly includes an output push-pull circuit 86 having FETs 88, 90. The drains of these FETs are connected to an output chip slotline 92, and the sources are connected to a base ground conductor 94. Slotline 92 is flip-mounted to an output base slotline 96. This structure is similar to that of output interface 60.

Figure 5:
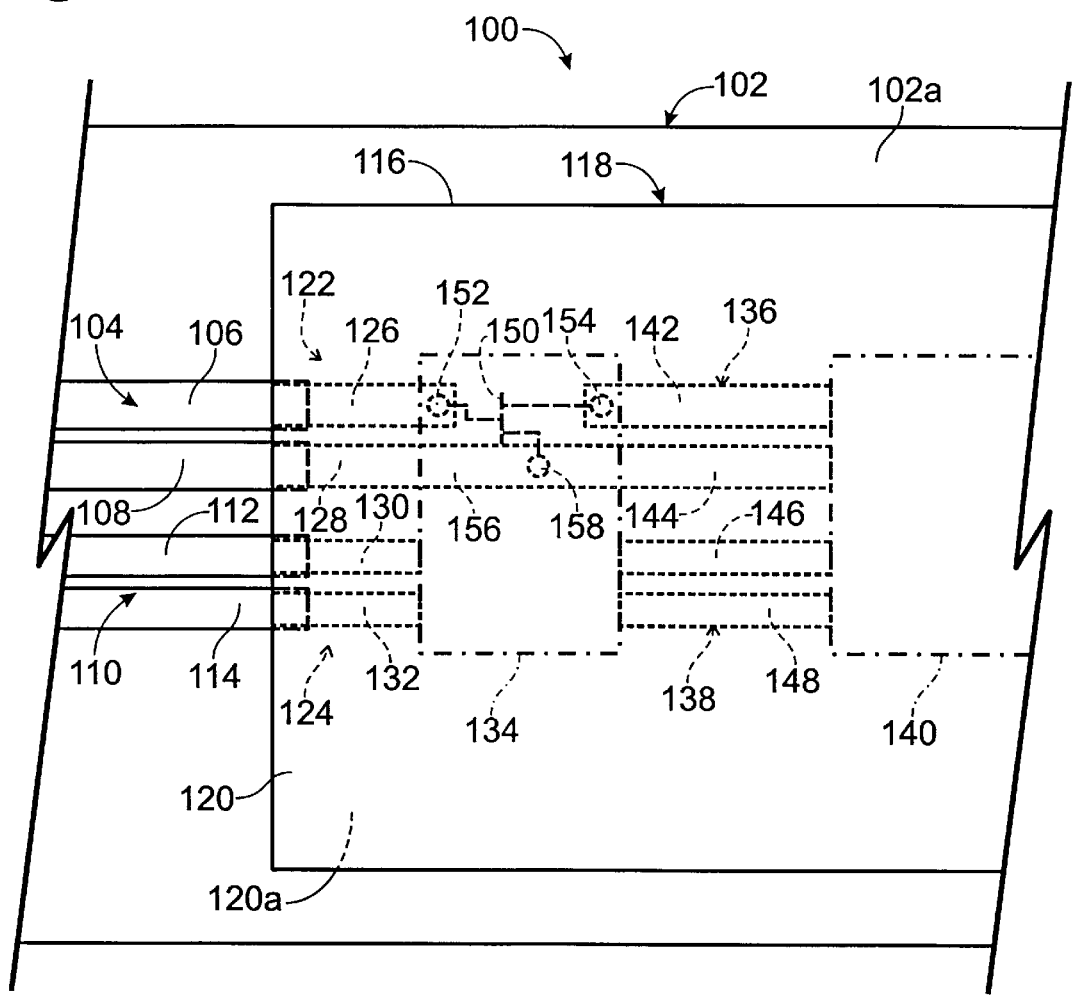
FIG. 5 is a plan view of yet another embodiment of the invention.

Referring now to FIG. 5, a circuit 100 made according to the invention further includes multiple, electrically parallel on-chip slotlines. Circuit 100 illustrates configurations of slotlines on a base substrate and on a chip substrate that are based on the single slotline configurations illustrated in FIGS. 1–4.

More particular, circuit 100 includes a base substrate 102 having a face 102a on which are mounted a first base slotline 104 having base conductors 106, 108, and a second base slotline 110 having base conductors 112, 114. It is seen that the first and second base slotlines extend under a chip 116 defining a connection region 118 of substrate 102. Terminals of the chip are flip mounted to terminals of the base slotlines in the connection region, as has been described with reference to the earlier embodiments.

Chip 116 has a chip substrate 120 with a hidden face 120a facing substrate face 102a. Two interface (input/output) chip slotlines 122, 124 having respective chip conductors 126, 128 and 130, 132 formed on chip face 120a. Conductors 128 and 130 could be formed as a single conductor. The ends of the chip slotlines are flip mounted to respective base slotlines 104, 110. Slotlines 122, 124 are connected to a circuit 134 formed on the chip. Circuit 134 may be an intermediate circuit as described previously or part of an intermediate circuit, and may contain active devices, depending upon the application.

Intermediate chip slotlines 136, 138 interconnect circuit 134 with a second on-chip circuit 140. Slotlines 136, 138 consist of respective conductors 142, 144 and 146, 148.

Each pair of slotlines, that is base slotlines 104, 110, interface chip slotlines 122, 124 and intermediate chip slotlines 136, 138, are shown in physical parallel relationship. In one application of circuit 100, the slotlines in each pair of slotlines are also electrically in parallel, and also are used to conduct the same signal. This configuration is particularly useful to provide for improved impedance matching, and to process multiples of signals through the chip circuits. Greater amplification of a signal may be possible at lower noise levels by using multiples of low noise amplifiers for instance. In other applications it may be desirable to process the individual signals differently.

Illustrated in circuit 134 of FIG. 5 is a simplified chip circuit coupling slotlines 122 and 136 that is representative of a circuit configuration that can be used at on-chip slotline interfaces. A single active device, shown as FET 150, is connected to both slotlines. The gate is connected to conductor 126 at a terminal 152. The drain is connected to conductor 126 at a terminal 152. The drain is connected to conductor 142 at a terminal 154. The source is connected to a conductor section 156 at a terminal 158. In the configuration shown, conductor section 156 joins conductors 128 and 144. It is seen that this single-FET configuration could also be used for connecting another circuit to an input slotline or to an output slotline.

Other conductor configurations are also possible. For instance, conductor section 156 could join conductor 126 with conductor 144 and the gate could be connected to conductor 128.

It will be appreciated that such a circuit provides a relatively simple chip interface having reduced numbers of conductors, thereby allowing for increased numbers of signal interfaces for a chip of a given size or reduction in the size of the chip. Isolation and ease of manufacture are improved.

Although the present invention has been described in detail with reference to particular preferred embodiments, persons possessing ordinary skill in the art to which this invention pertains will appreciate that various modifications and enhancements may be made without departing from the spirit and scope of the claims as written and as judicially construed under the doctrine of equivalents. For instance, the push-pull circuit may be any push-pull circuit and the intermediate circuits may correspondingly be any appropriate circuit. The exemplary push-pull circuit using a pair of FETs could be simplified by use of a single FET. The above disclosure is thus intended for purposes of illustration but not limitation.

The invention claimed is:

1. A high-frequency circuit structure comprising:
   an electrically insulating base substrate having a planar face;
   a first base slotline mounted on said base substrate face and consisting of first and second, spaced-apart coplanar base conductors; and
   a circuit chip flip-mounted onto said base substrate and comprising:
      an electrically insulating chip substrate having a planar face facing the planar face of the base substrate; and
      a first chip slotline mounted on said chip substrate face and comprising first and second spaced-apart chip conductors flip-mounted onto said first and second base conductors, respectively.

2. A circuit structure according to claim 1 wherein said chip comprises an active device having first and second device terminals coupled, respectively, to said first and second chip conductors.

3. A circuit structure according to claim 2 wherein said active device further comprises first and second transistors connected in series, with said first transistor having said first device terminal and said second transistor having said second device terminal.

4. A circuit structure according to claim 2 wherein said active device further comprises a first transistor having a first control terminal and a second transistor having as second control terminal, said first control terminal comprising said first device terminal and said second control terminal comprising said second device terminal.

5. A circuit structure according to claim 2 wherein said active device further comprises first and second transistors each including two current-carrying terminals, a current-carrying terminal of said first transistor comprising said first device terminal and a current-carrying terminal of said second transistor comprising said second device terminal.

6. A circuit structure according to claim 1 further comprising:
   a second base slotline also mounted on said base substrate face and comprising third and fourth spaced-apart coplanar base conductors; and
   said chip further comprising a second chip slotline mounted on said chip substrate face and comprising third and fourth spaced-apart coplanar chip conductors, said third and fourth chip conductors being flip-mounted onto said third and fourth base conductors, respectively.

7. A circuit structure according to claim 6 further comprising an intermediate circuit coupled electrically to said first and second chip slotlines.

8. A circuit structure according to claim 7 wherein said intermediate circuit is provided on said chip substrate.

9. A circuit structure according to claim 8 wherein said intermediate circuit comprises at least one active device.

10. A circuit structure according to claim 8 wherein said intermediate circuit comprises first and second transistors having respective control terminals coupled to said first chip slotline, and third and fourth transistors having respective current-carrying terminals coupled to said second chip slotline.

11. A circuit structure according to claim 7 wherein said intermediate circuit is connected electrically between said first and second chip slotlines.

12. A circuit structure according to claim 7 wherein said intermediate circuit is mounted on said base substrate and is coupled to said first and second base slotlines.

13. A circuit structure according to claim 7 wherein said first and second slotlines are connected in parallel relative to said intermediate circuit.

14. A circuit structure according to claim 1 wherein said chip further comprises a second chip slotline and a chip circuit mounted on the chip substrate that is connected electrically between said first and second chip slotlines.

* * * * *